(12) United States Patent
Denk et al.

(10) Patent No.: US 6,316,950 B1
(45) Date of Patent: Nov. 13, 2001

(54) METHOD AND APPARATUS FOR IMAGING SEMICONDUCTOR DEVICES

(75) Inventors: Winfried Denk; Chunhui Xu, both of Berkeley Heights, NJ (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/856,561

(22) Filed: May 15, 1997

(51) Int. Cl.[7] .................. G01R 31/265; G01R 31/311
(52) U.S. Cl. .................. 324/752; 324/753; 324/765; 324/501
(58) Field of Search .................. 324/752, 753, 324/765, 766, 501

(56) References Cited

U.S. PATENT DOCUMENTS

| | | | |
|---|---|---|---|
| 4,346,348 | * 8/1982 | Bartoli et al. | 324/765 |
| 5,034,613 | 7/1991 | Denk et al. | 250/458.1 |
| 5,289,407 | 2/1994 | Strickler et al. | 365/106 |
| 5,334,540 | 8/1994 | Ishii | 437/7 |
| 5,430,305 | * 7/1995 | Cole, Jr. et al. | 250/559.07 |

FOREIGN PATENT DOCUMENTS 196 09 521    9/1996 (DE) .

* cited by examiner

Primary Examiner—Glenn W. Brown

(57) ABSTRACT

Semiconductor devices are imaged using two-photon absorption. The method is similar to conventional optical beam induced imaging except that the light beams used have frequencies (photon energies) insufficient to excite electrons across the semiconductor bandgap. Rather the instantaneous intensity of the lower frequency light is increased, as by using a pulsed laser source, so that electron transitions occur by two-photon absorption predominately in the localized region where the beam is focused. The result is minimal absorption during passage through the substrate and maximal absorption in the component-rich active layer where the beam is focused. This enhances imaging of fine-detail semiconductor devices. Specifically, the quadratic dependence of free carrier generation on the excitation intensity both enhances the resolution and provides a three-dimensional sectioning capability.

6 Claims, 3 Drawing Sheets

METHOD AND APPARATUS FOR IMAGING SEMICONDUCTOR DEVICES

FIELD OF THE INVENTION

This invention relates to imaging of semiconductor devices and, in particular, to methods and apparatus for imaging such devices using two-photon absorption.

BACKGROUND OF THE INVENTION

Imaging of structures within semiconductors is of interest not only as a research tool but also as a technique of considerable practical importance in the design, fabrication and testing of semiconductor electronic and optoelectronic devices such as integrated circuits. The operating components of such devices are tiny structures having sub-micron features that can be meaningfully viewed only with microscopic techniques.

Considerable difficulty is encountered in viewing a state-of-the-art semiconductor device because plural layers of connective metallization overlie the operative components on the top and a relatively thick silicon layer underlies the components on the bottom.

One approach to microscopically imaging the components is to use optical beam induced current imaging. A focused beam of light at a frequency suitable for exciting electrons from the semiconductor valence band to the conduction band is scanned over the semiconductor chip and the resulting current is measured. From the current generated and the location of the scanning beam, a computer with image processing software can generate an image representative of the features of the device.

Since the top is usually covered with metal, the device is usually scanned through the bottom. The difficulty with this approach, however, is that the beam encounters absorption in passing through the underlying substrate before it reaches the active layer on the upper surface of the device. This reduces the light available for exciting current at the component-rich active layer and superimposes spurious background effects. The result is limitation on the precision with which components can be imaged. Accordingly there is a need for improved methods and apparatus for imaging semiconductor devices.

SUMMARY OF THE INVENTION

In accordance with the invention, semiconductor devices are imaged using two-photon absorption. The method is similar to conventional optical beam induced imaging except that the light beams used have frequencies (photon energies) insufficient to excite electrons across the semiconductor bandgap. Rather the instantaneous intensity of the lower frequency light is increased, as by using a pulsed laser source, so that electron transitions occur by two-photon absorption predominately in the localized region where the beam is focused. The result is minimal absorption during passage through the substrate and maximal absorption in the component-rich active layer where the beam is focused. This enhances imaging of fine-detail semiconductor devices. Specifically, the quadratic dependence of free carrier generation on the excitation intensity both enhances the resolution and provides a three-dimensional sectioning capability.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and, except for the photographs, are not to scale.

DETAILED DESCRIPTION

Figure 1:
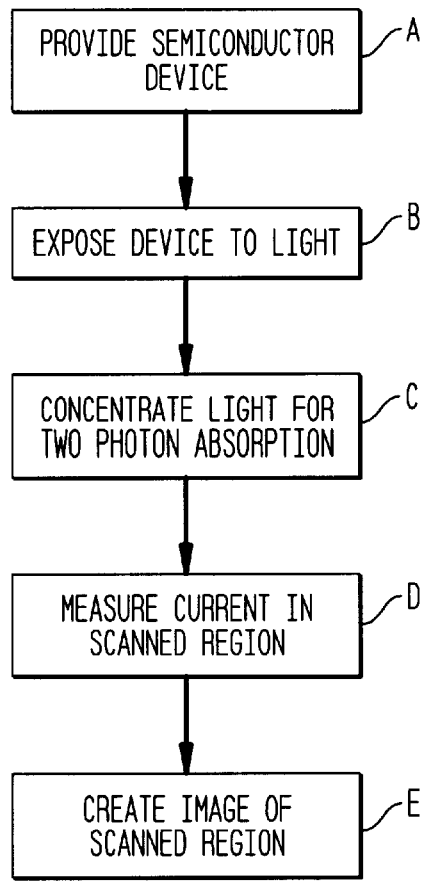
FIG. 1 is a block diagram of the steps involved in imaging a semiconductor device in accordance with the invention.

Referring to the drawings, FIG. 1 is a block diagram of a method for imaging a semiconductor device in accordance with the invention. As shown in block A, the first step is to provide a semiconductor device in suitable presentation for imaging. Typically the device is in the form of a semiconductor chip, such as a monocrystalline silicon chip, having its active components formed adjacent an upper planar surface. These components can include various impurity-doped regions defining electronic devices such as resistors, capacitors or transistors or photoelectronic devices such as LEDs, solid state lasers or planar waveguides.

In the absence of blockage, the devices could be imaged either from above the active surface or from below through the underlying substrate. However, optical access from the top is often blocked by overlying layers of metallization. While the metal can be removed, such removal will often damage the structures to be observed. So the device components will be imaged from below, through the substrate.

Figure 2:
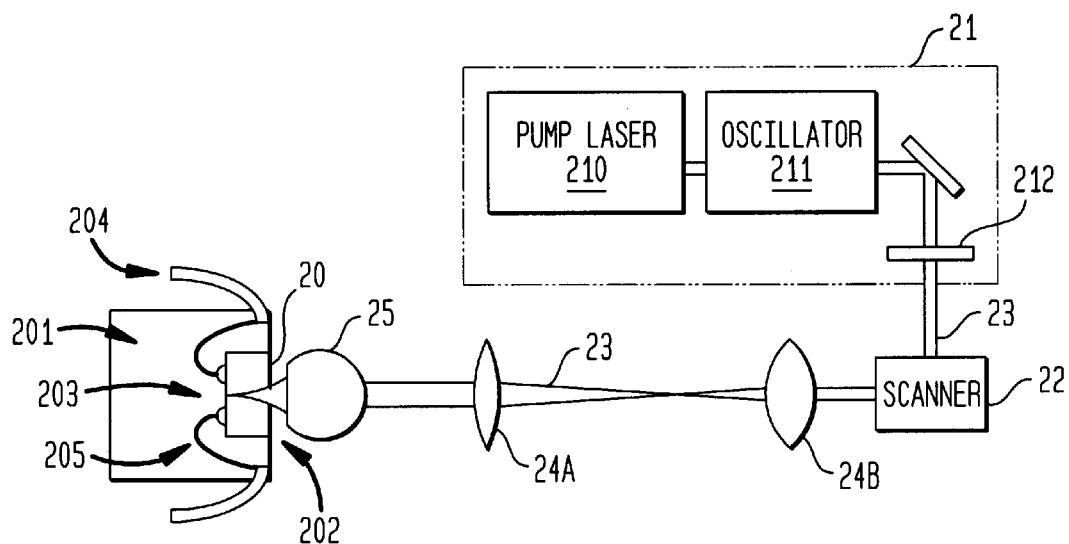
FIG. 2 is a schematic diagram of apparatus useful in practicing the method of FIG. 1.

FIG. 2, which is a schematic diagram of preferred apparatus for practicing the method of FIG. 1, illustrates a preferred presentation of the semiconductor device 20 embedded in a plastic body 201 with the substrate bottom 202 exposed for viewing and a component-rich upper surface 203 embedded within the plastic. Conductive leads 204, 205 to electrodes across the region to be imaged are extended out of the plastic. The surface with substrate bottom 202 is advantageously polished to a mirror finish.

Figure 3:
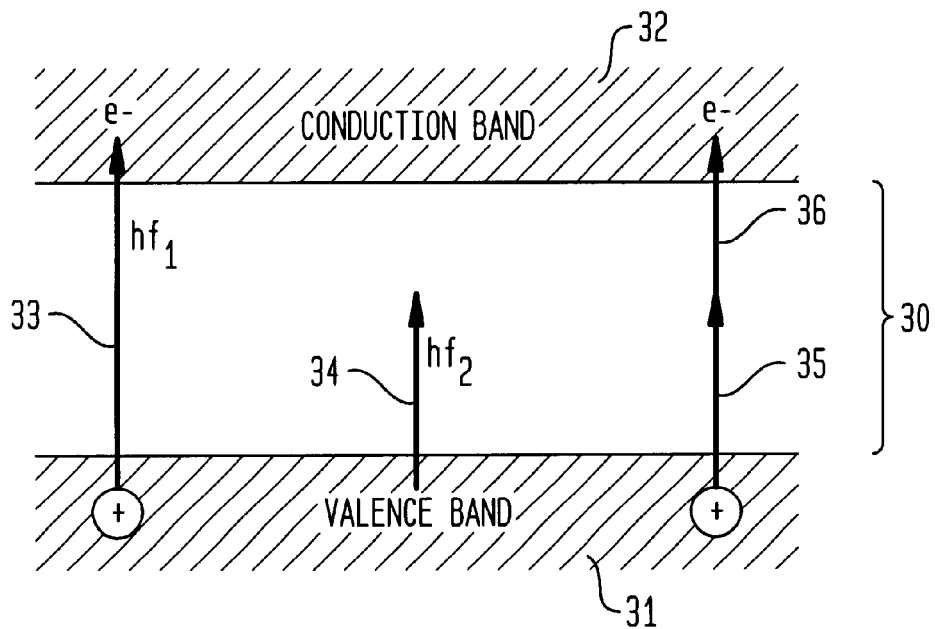
FIG. 3 is a simplified energy band diagram of a typical semiconductor useful in explaining the method of FIG. 1.

The next step shown in block B is to expose the device to light at a wavelength which is normally not absorbed by the substrate but which, in sufficient intensity, will be absorbed by two-photon absorption. This can be understood by consideration of FIG. 3 which schematically illustrates the well-known energy band characteristic of crystalline semiconductors. In essence, there is a "forbidden" energy gap 30 between a valence band 31 and a conduction band 32 in which electrons cannot reside. The energy difference between these bands is the gap energy E. Light 33 having a photon energy $hf_1$ greater than the gap energy E can excite electrons from the valence band (leaving conductive "holes") to the conduction band, so such light can be absorbed. Light 34 having photon energy $hf_2$ less than the gap energy E will not normally excite an electron transition. Such light at normal intensities will pass through the semiconductor unattenuated. However, if the energy of two photons is greater than E, i.e. $2hf_2 > E$, then at sufficient intensity some electrons will simultaneously absorb two photons 35, 36 and be excited from the valence band to the conduction band thereby generating charge carriers and current.

As shown in Block C, the light shone on the device is concentrated to achieve two-photon absorption without damaging the device being imaged. In typical applications this means that the light is concentrated in space, as by focusing. It is also advantageously concentrated in time as by the use of a pulsed laser light source. It is an advantage of this method that light will pass through the semiconductor substrate essentially unattenuated until it is sufficiently concentrated at the point of focus to excite two-photon absorption. By control of the depth of focus, one can choose the depth into the device of the region being examined. It is thus possible to image a particular planar region of interest, or by examining successively displaced planar regions, to generate a three-dimensional image of the device. Use of a pulsed laser not only concentrates available optical power, but by reducing the average power needed, it also minimizes damage to the semiconductor device. During the exposure step shown in block D the light is scanned and the current generated by two-photon absorption in the scanned region is measured.

The final step, shown in block E, is to create an image of the region scanned based on the current generated at each beam location. This is advantageously done using a computer to simultaneously control the scan and to receive the measured current for each scan location.

FIG. 2 schematically illustrates a preferred apparatus for imaging a semiconductor device 20 comprising an illumination source 21 for providing a beam of light at a non-absorbing frequency $f$ that will absorb in two-photon absorption (hf<$\epsilon$<2hf). The source 21 can conveniently comprise a pump laser 210, an optical parametric oscillator 211, and an attenuator 212 for controlling the illumination intensity. In a preferred device, the laser 210 is a mod-elocked femtosecond Ti: sapphire pulsed laser marketed by Spectra Physics under the tradename Tsunami. The oscillator 211 is an optical parametric oscillator marketed by Spectra Physics, Mountainview, Calif. under the tradename Opal. The attenuator can be a 50G00AV.1 from the Newport Corporation, Irvine, Calif. For imaging a silicon integrated circuit, an exemplary excitation pulse width is 120 fs, the repetition rate can be 80 Mhz and the wavelength should be longer than 1.2 micrometers to avoid single—photon absorption. Advantageously the wavelength is in the range 1.6 to 1.2 micrometers. Alternatively, the optical excitation can be provided by other sources such as pulsed sub-picosecond lasers developed for telecommunications applications in the 1300 nm and 1550 nm wavelength regions.

A scanner 22 is provided for scanning the beam 23 over the device to be imaged. A preferred scanner is a raster scanner composed of two scan mirrors such as a 6800 Minor Positioning System marketed by Cambridge Technology, Inc., Watertown, Mass.

Relay lenses 24A, 24B are advantageously provided for imaging the scan mirrors to the back aperture of an objective lens 25. The relay lenses also serve to control the beam diameter. Suitable relay lenses are available from Spindler & Hoyer Inc.

The objective lens 25 focuses the illumination beam 23 on the desired region of the device 20. Applicants utilized four objective lenses purchased from Carl Zeiss Inc., Thornwood, N.Y. (10x/0.3 NA; 20x/0.5 NA; 100x/1.3 NA; and 63x/1.4 NA).

As an alternative to the above described scanning and focusing apparatus, one can advantageously substitute a commercially available scanning microscope such as the LSM321R from Carl Zeiss, Inc. or the MRC600 from Biorad Inc. A light source suitable for exciting twophoton absorption such as source 21, above, is substituted for the OEM light source. The computer software with these commercial microscopes can be used in forming the two-photon image.

Figure 4:
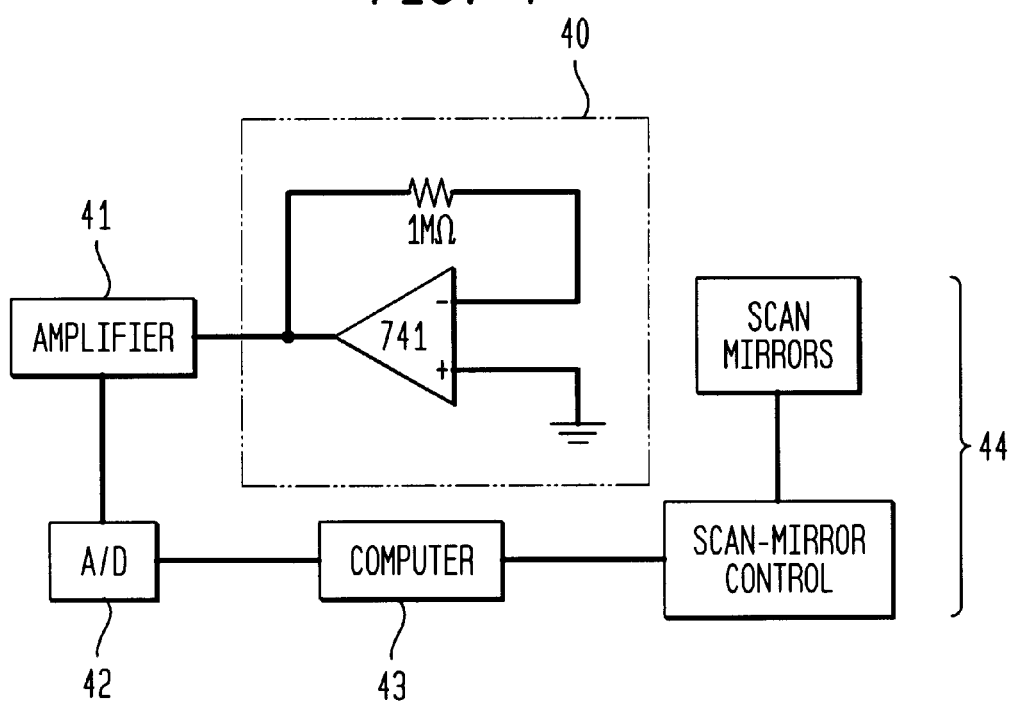
FIG. 4 illustrates the electronic control and measurement portion of the FIG. 3 apparatus.

The nature and advantages of the invention can now be more clearly understood by consideration of the following specific example. A $\mu$A741 operational amplifier chip from Texas Instruments was prepared for presentation as shown in FIG. 2. As shown in FIG. 4, the amplifier bias current of the chip 40 was connected via amplifier 41 and A/D converter 42 to the same computer 43 used to control the scanner 44. The computer thus has the position and current information for processing the desired image.

Figure 5:
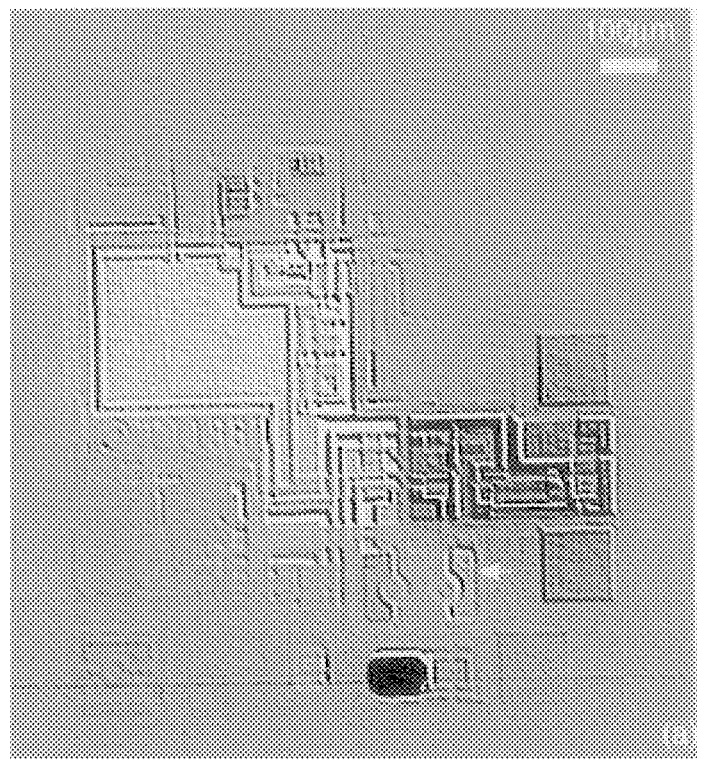
FIGS. 5, 6 and 7 are exemplary images made in accordance with the method of FIG. 1 of an integrated circuit device.

FIG. 5 depicts an image generated using a 10x/0.3 NA objective lens. Image brightness illustrates the induced current level. Current can be of either polarity, with areas of the integrated circuit darker than background indicating a current out of the negative input. Edge enhancement has been used in this view. The arrow marks a transistor.

Figure 6:
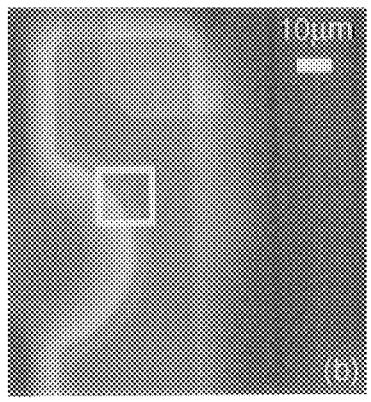
Figure 7:
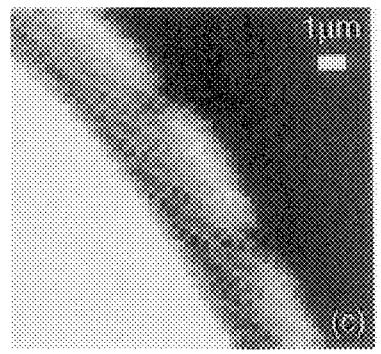

FIG. 6 depicts the marked transistor at higher magnification taken with a 100x/1.3 NA oil immersion lens. No edge enhancement was used. FIG. 7 is a higher magnification view of the boxed portion of FIG. 6.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

What is claim:

1. In the method of optical beam induced current imaging of a semiconductor device formed on a region of a semiconductor chip comprising the steps of scanning said region with a beam of light for exciting electrons between the valence band of the semiconductor to the conduction band, thereby generating charge carriers and current in the regions exposed to said beam, and generating from the location of the regions exposed to said beam and the current generated in said exposed regions, an image representative of features of the region scanned, the improvement wherein said scanning is performed with a beam of light having sufficient photon energy and intensity to excite electrons between said band by two-photon absorption but sufficient photon energy to excite conduction electrons by single-photon absorption.

2. The improved method of claim 1 wherein said semiconductor chip comprises a body having first and second major surfaces, said semiconductor device is located at the first major surface and said scanning is performed with said beam of light focused at said first major surface.

3. The method of claim 2 wherein said scanning is through said second major surface.

4. The method of claim 2 wherein said scanning is with a beam of pulsed laser light.

5. The method of claim 2 wherein said semiconductor device is a silicon semiconductor device and said scanning is with a beam of light having a wavelength in the range 1.6 micrometers to 1.2 micrometers.

6. The method of claim 2 wherein said semiconductor device is a silicon integrated circuit device.

* * * * *